(12) United States Patent
Garreau et al.

(10) Patent No.: US 7,069,524 B2
(45) Date of Patent: Jun. 27, 2006

(54) METHOD AND DEVICE FOR ANALYZING A NETWORK OF CONDUCTORS

(75) Inventors: Dominique Garreau, Rue Du Temps des Cerises (FR); Thierry Fernandez, Parc De Lattre De Tassigny (FR)

(73) Assignee: Laboratoire Europeen ADSL Lecom Fastnet, Cesson Sevigne (FR)

( * ) Notice: Subject to any disclaimer, the term of this patent is extended or adjusted under 35 U.S.C. 154(b) by 0 days.

(21) Appl. No.: 10/257,910

(22) PCT Filed: Apr. 18, 2001

(86) PCT No.: PCT/FR01/01197

§ 371 (c)(1),
(2), (4) Date: Feb. 27, 2003

(87) PCT Pub. No.: WO01/79870

PCT Pub. Date: Oct. 25, 2001

(65) Prior Publication Data

US 2003/0163264 A1 Aug. 28, 2003

(30) Foreign Application Priority Data

Apr. 18, 2000 (FR) .................................. 00 05010

(51) Int. Cl.
*G06F 17/50* (2006.01)
*G01V 3/00* (2006.01)
*G01R 23/00* (2006.01)

(52) U.S. Cl. ..................... 716/4; 324/312; 324/76.19

(58) Field of Classification Search .................... 716/4; 375/130, 142; 324/310–312, 76.19, 76.22
See application file for complete search history.

(56) References Cited

U.S. PATENT DOCUMENTS

| | | | | |
|---|---|---|---|---|
| 3,967,283 A | * | 6/1976 | Clark et al. | 342/28 |
| 5,109,275 A | * | 4/1992 | Naka et al. | 358/518 |
| 5,289,498 A | * | 2/1994 | Hurlbut et al. | 375/142 |
| 5,307,284 A | | 4/1994 | Brunfeldt et al. | 364/485 |
| 5,655,108 A | | 8/1997 | Uchiyama | 395/500 |
| 5,832,364 A | * | 11/1998 | Gustafson | 455/14 |
| 5,910,109 A | * | 6/1999 | Peters et al. | 600/316 |
| 5,973,896 A | * | 10/1999 | Hirsh et al. | 361/54 |

FOREIGN PATENT DOCUMENTS

WO WO 97 27685 7/1997

* cited by examiner

*Primary Examiner*—Paul Dinh
(74) *Attorney, Agent, or Firm*—Boyle, Fredrickson, Newholm, Stein & Gratz, S.C.

(57) ABSTRACT

To analyze a network of conductors, especially an electrical power supply network, it is planned to measure the spectral (49) and temporal (50) nature of a signal available at a node of the network. An image (49–51) representing this state is produced. This image produced is compared with an expected image (52–55) showing an <<on>> state of one and/or the other of the appliances connected to this network. The state of the appliances, whether on or off, is deduced therefrom. This information can be used to optimize the use of the electrical power or to monitor the activity of the appliances concerned.

20 Claims, 3 Drawing Sheets

METHOD AND DEVICE FOR ANALYZING A NETWORK OF CONDUCTORS

An object of the present invention is a method and device for the analysis of a network of conductors. It can be used more particularly in the field of domestic or industrial electrical power supplies. However, it can be used in other cases. In particular it can be used to monitor the state of the connections on any wire network. In this case, it can be used especially to detect the fraudulent connection of appliances to a computer network, for example to verify the "on" or "off" state of public telephones connected to a telephone network.

In the field of electrical power supplies, the value of the invention is that it enables, for example, an electricity supplier to give consumers who are his customers a historical record of the use of appliances put into operation at their premises. This kind of historical record is of immediate interest. Indeed, it makes it possible to immediately recognize electrical power consumption peaks and the nature of the appliances involved in this consumption. The user and the electrical power supplier can then agree on ways to organize a time-staggering arrangement for powering on certain appliances so as to reduce the peak power supplied to the user. The reduction of this peak power then enables the electrical power supplier to be able to supply several users by means of the same network of electrical power conductors without exceeding the tolerance values as regards heat dissipation in the conductors put into operation. The electrical power supplier can furthermore grant advantageous price arrangements to users who subscribe to this kind of monitoring system.

In the monitoring of networks other than those of electrical power distribution, an operator exploiting a network may detect modifications in the connections of the network and may soon realize that the system is being fraudulently used or that a listening-in system is being implemented on a link. Other needs can also be envisaged.

At present, there is no device and method for the analysis of a network of conductors. Indeed, these networks may be so complex that it is difficult to see how such an analysis could be efficiently conducted. At most, in the field of the detection of malfunctions, there are known methods of reflectometry in which, for a point-to-point link, a signal is sent out and the duration between the transmission of this signal and the reception of a return echo at the transmission point is measured. By dividing this duration by the speed of propagation of the electrical waves in the conductors, it is possible to deduce the place in which the malfunction is located. In the invention, the problem to be resolved is different: it has to be known whether or not the appliance is in operation. If the appliance is a single appliance connected to the end of single power supply conductors, naturally, the "on" or "off" state of the connected appliance can be deduced from the current flowing in these conductors. However, in this case, this is not a network since there is only one set of power supply conductors for a single appliance. The invention, for its part, seeks to resolve the problem of the coexistence of numerous appliances on a network of conductors. In practice, a network of conductors is thus constituted by arborescent or tree structure of connections in which the ends of the branches lead to differentiated appliances which may or may not be in operation.

This problem will be resolved in the method and device according to the invention by measuring an available signal at a node of the network, and especially by extracting spectral and temporal characteristics therefrom. In the spectral and temporal characteristics of course, the frequency of the alternating power supply signal will be eliminated as being not at all characteristic of the phenomenon of the "off" or "on" state of each of the appliances connected to the network. In the invention, it has been realized that the available signal comprises spectral characteristics representing the reflection of the electrical waves on the terminations of the tree structure concerned.

On the whole, if an appliance is not in operation, the extremity of the power supply conductor that reaches it may be considered to be unconnected. It then behaves like an open circuit and gives rise to reflections of the signals propagated in the conductors. If, on the contrary, the appliance is in operation, the extremity of the connection may be considered to be connected to a load; the echo is therefore different.

In taking account of a given architecture of the network of conductors, it is considered in the invention that this architecture does not have to be modified far too frequently. Indeed, it is less frequent for new workshops and offices having new interconnections of electrical networks to be put into operation than it is for the appliances connecting these networks to be turned on or off every day.

In the invention, by performing fairly precise analyses of the spectral and/or temporal characteristics, it has been shown that it is possible to identify the "on" or "off" state of the different appliances connected to a network. As needed, the operation can be limited to the study of only some of the connected appliances. Thus, it may be chosen to monitor certain appliances identifiable in advance, to the exclusion of other appliances which are not considered.

An object of the present invention therefore is a method for the analysis of a network of electrical power supply conductors, characterized in that it comprises steps of:
measuring an available signal at a node of the network,
producing a temporal or spectral image of the available signal,
comparing the image produced with an expected image,
deducing therefrom the "on" or "off" state of one of several appliances connected to the network and corresponding to this expected image.

An object of the invention is also a device for the analysis of a network of electrical power supply conductors comprising a circuit for the measurement, at a node of the network, of an available signal, a circuit to produce a temporal and/or spectral image of the available signal, characterized in that it comprises a circuit to compare the image produced with an expected image, and a circuit to deduce a state of operation of one among several appliances connected to the network and corresponding to this expected image.

The invention will be understood more clearly from the following description and the appended figures. These figures are given purely by way of an indication and in no way restrict the scope of the invention. Of these figures.

Figure 1:
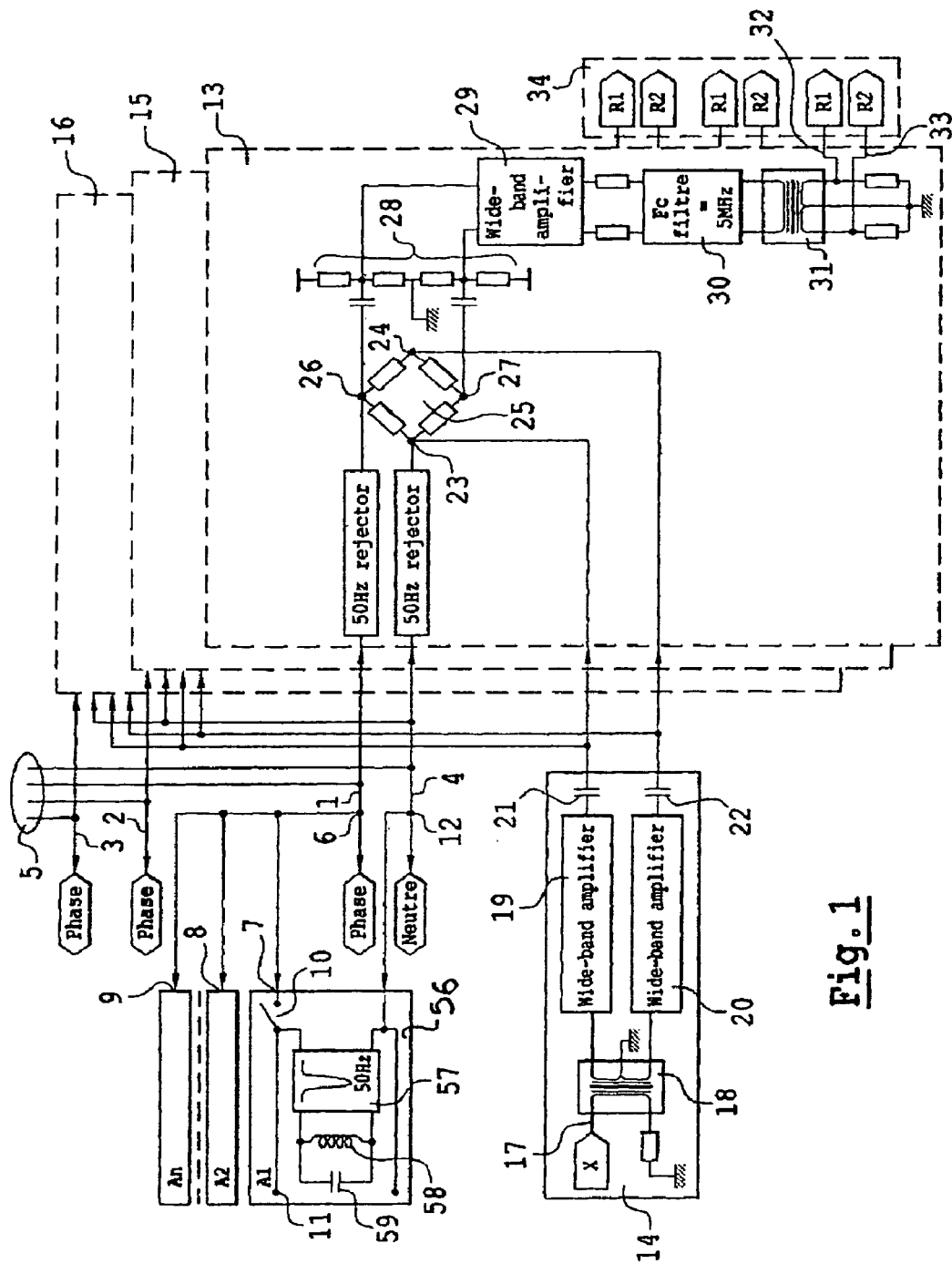
FIG. 1 is a diagrammatic view of a network of conductors according to the invention and, in a particular case, of the injection of a characteristic signal and the measurement of the characteristic signal reflected by the network as an available signal.

FIG. 1 shows a device that can be used to implement the method for analyzing a network of conductors according to the invention. A network of conductors, in one example, may be a network 5 of electrical power supply conductors. In this general case, the device has three phase conductors 1, 2 and 3 and one neutral conductor 4. Although a network 5 of this kind herein is a three-phase network, the following explanation will refer to as single-phase electrical power supply network in which only one phase, namely that of the two conductors 1 and 4, is involved. However, the network may be a different type of network, in particular a two-wire telephone type network comprising two wires through which the public phones are electrically powered and, at the same time, convey speech signals between speakers. The invention can of course be transposed to any other type of network of electrical conductors.

The particular feature of the network 5 is that it enables the connection and putting into operation of a certain number of appliances, in this case for example the appliances A1, A2, . . . An. Starting from a node 6 of this network, the network 5 therefore has a tree structure with connection ends 7, 8 and 9 to power the appliances A1, . . . An. Each appliance is provided, in one way or another, with a switch such as 10 enabling the connection of one of the ends 7 to 9 to a service input 11 of the appliance or, on the contrary, enabling the end 7 to be left unconnected. As a case may be, the impedance presented by the connected appliance, as perceived from the network, will be considered to be a matched impedance or mismatched impedance respectively. Naturally, all the appliances A1 to An are designed to be put into operation randomly and the purpose of the invention is to produce a piece of information on the powering-on of each of the appliances.

To this end, an available signal is measured at a node of the network, especially at the node 6. In view of the electrical character of the signal, the node 6 will be measured with reference to another node, for example the node 12 located at the neutral connection 4. The term "node" covers a notion with a generic meaning. It signifies a place at which an available signal is tapped.

The available signal may be a noise signal existing in the network 5. Indeed, when connected, electrical appliances have several effects on the noise. First of all, they modify the impedance of the network. This affects the noise available at the node 6. Secondly, many appliances themselves generate their own noise which is characteristic of their being put into operation. As an improvement, rather than measuring the noise as an available signal, it is preferred in the invention to inject a characteristic signal into the nodes 6 and 12 in order to recover this characteristic signal, reflected by the network 5, at the point of this injection.

An injection device used for this purpose comprises a coupler 13 connected to an injector 14. Should the network in question be a three-phase network, the coupler 13 is duplicated in the form of identical couplers 15 and 16. The injector 14, in one example, comprises an input 17 for signals to be injected, connected to the ground by a primary winding of the electrical transformer 18. The signal picked up at the secondary winding of the transformer 18 is applied, for example by means of wideband amplifiers 19 and 20 and capacitors 21 and 22 which are respectively series-connected, to two inputs 23 and 24 of a Wheatstone bridge 25. Two intermediate outputs 26 and 27 of the bridge 25 are connected, especially by means of a bias circuit 28, a wideband amplifier 29, a low-pass filter 30 and a transformer 31 (of the same type as the transformer 18), to two measurement outputs 32 and 33 to produce signals R1 and R2.

The injection into the network 5 is done by connecting one of the inputs, for example the input 23 of the bridge 25 and a midpoint of one of the arms of this bridge, for example the midpoint 26, to the network 5, in this case respectively to the conductor 4 and 1. Preferably, the connection to the network 5 is made by means of two rejection filters enabling the elimination, in the received signal, of an alternating fluctuation component of the power supply network. In this case, the rejection frequency of 50 Hz should be modified if the electrical power supply network is at another frequency, for example 60 Hz. Should it be envisaged to monitor a DC electrical power supply network, especially in the case of the monitoring of public phones, the rejection filters will be replaced by high-pass filters. The coupler 13 plays the role of a duplexer.

This duplexer works as follows. An electrical signal produced by the injector 14 and admitted at the inputs 23 and 24 of the bridge 25 is echoed, if the resistors of the bridge 25 are very precisely computed, as a zero signal available between the terminals of outputs 26 and 27. However, this injected signal is echoed as a significant signal available between the terminals 23 and 26. This sent signal is therefore transmitted through rejection filters to the conductors 1 and 4 from where it gets propagated up to the appliances A1 an An.

Depending on whether these appliances are on or off, this signal is reflected and returns to the rejection filters at the points 23 and 26 of the bridge 25. From there, a part of the power enters the bias circuit 28 by means of the points 26 and 27 while another part is sent to the injector 14 by means of the points 23 and 24. The transformer 18, as well as the components to which it is connected, are adjusted in such a way that the echo received and sent back to the injector 18 is dissipated into this injector as perfectly as possible, without any stray reflections. The way to overcome leakages from the duplexer will furthermore be shown here below.

As for the couplers 15 and 16, they are identical to the couplers 13 in the sense that they receive signals from the (preferably) single injector 14. They are different in the sense that they are connected to the neutral point 4 but to another conductor 2 or 3 of the three-phase network 5. At output of their transformer 31, these other couplers too produce signals R1 and R2 available at the two poles of the secondary winding of these transformers.

Figure 2:
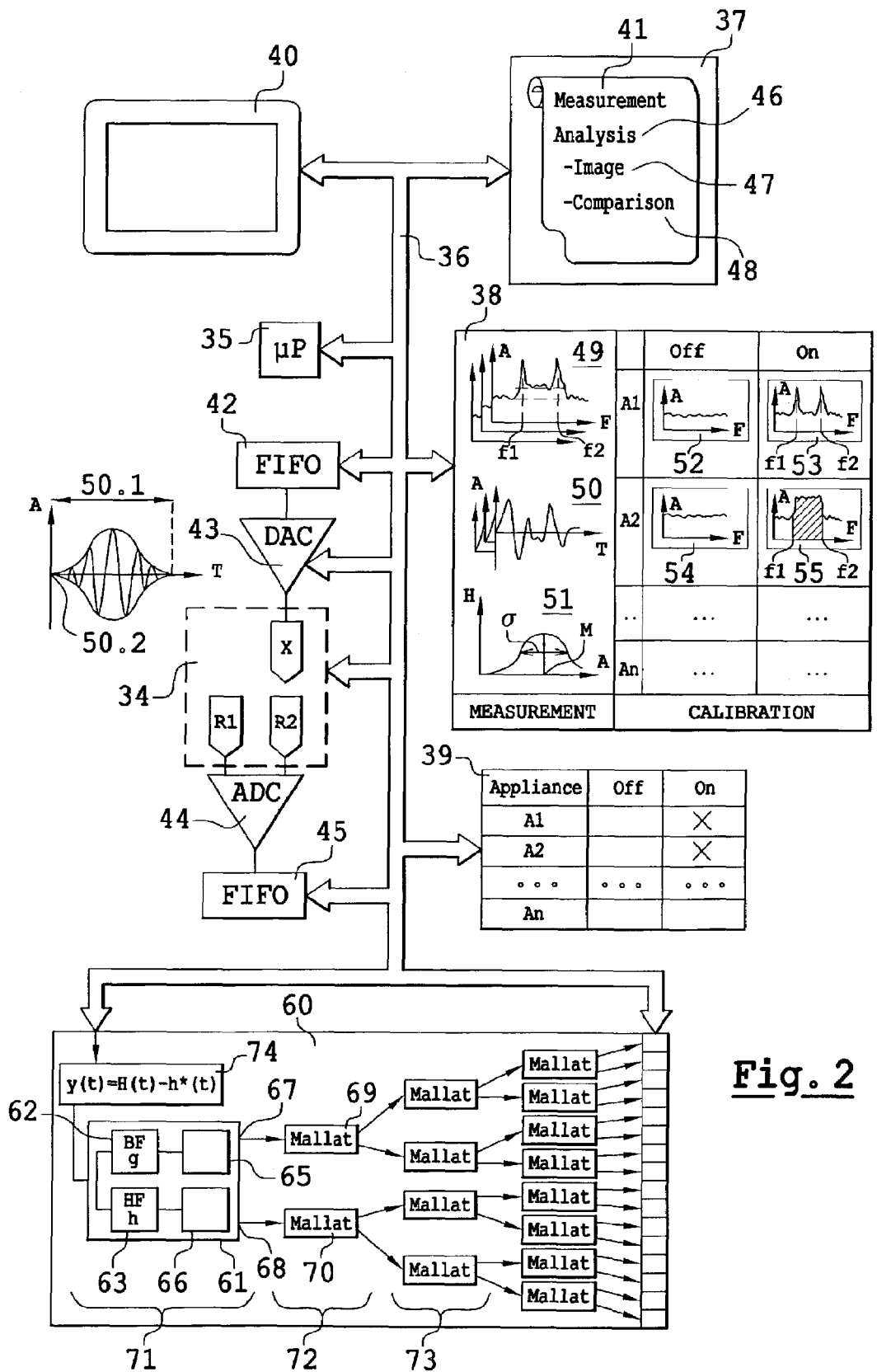
FIG. 2 is a diagrammatic view of the device for the production of an image of the available measured signal.

FIG. 2 gives. a more precise view of the analysis device and the method implemented. The injected signals X and measured signals R1 and R2 are available at an injection interface 34. In a preferred way, the measurement device of the invention will be a programmable device. To this end, it has a microprocessor 35 connected by means of a data, address and control bus 36 to a program memory 37, a data memory 38, a result memory 39 and a display screen 40.

To implement a measurement program 41, the microprocessor 35 loads a first-in-first-out type memory 41 with samples of a characteristic digital signal to be injected. These digital samples are converted by a digital-analog converter 43 into an analog signal X, available at the interface 34 which is also connected to the injection device of FIG. 1. At reception, the measured signals R1, R2 are converted by an analog-digital converter 44 and loaded, as and when they arrive, into a first-in-first-out type memory 45. The circuits 42, 43, 44 and 45 as well as the interface 34 are of course administered by the microprocessor 35.

Once the echo signal has been measured, an analysis program 46 contained in the memory 37 launches a first image production sub-program 47 and a second sub-program 48 for the comparison of the produced image with an expected image. The image produced may be a spectral image 49 or a temporal image 50. From the temporal history

50 of the available signal, it is possible to extract a certain number of digital samples, for example 1024 digital samples in a preferred mode. The temporal image may furthermore be a statistical image 51.

To obtain this image, a synchronous measurement of several experiments will be prompted. Thus, in one example, the signal sent out by the converter 43 will be a signal time-gated in a window 50.1, from a starting date 50.2. The received signal converted by the converter 44 may be indexed starting from the date 50.2. At the practical level, given the fact that the networks studied are short-distance networks, and with a conversion frequency of one MHz in the converters 43 and 44, it may be planned, during the period 50.1, to identify the samples received by their measurement date, in the form of a sample number, with respect to the date 50.2. If the experiment is repeated identically, it is thus possible to acquire several sets of samples that can be stored in the memory 45. Thus, a statistical processing operation is performed, in this case by simple averaging of the samples having a same index, to eliminate the consequences of a noise foreign to the signal sent during the window 50.1. This technique is called synchronous averaging. Thus, for each time-related index, there is available a mean value and a variance of the echo signal computed on the different experiments performed (typically 100).

In one example, the window 50.1 is said to be sinusoidal because, in its duration, the amplitude of the injected signal has a sinusoidal envelope.

Whether the work is done on a reflected signal or on the noise of the network, it is also provided in the invention that the available signal will be subjected to spectral analysis. This spectral analysis complements the temporal analysis. In this spectral analysis, a spectral breakdown is carried out on the signals available for each experiment. The amplitude of the spectral components is then indexed by frequency values. For several successive experiments, as in the temporal case, it is possible, in the case of each frequency value, to extract a mean spectral component as well as a variance of a spectral component. Preferably, the spectral analysis too will be carried out on 1024 spectral components with quantification, after statistical processing on two bytes, for each of the components.

In short, the image produced corresponding to the available signal will be an image which, in a preferred mode, comprises 1024 mean spectral values, 1024 spectral variance values, 1024 mean values of echo amplitude and 1024 values of echo variance. Since each value is encoded on two bytes, the image produced will take up memory space corresponding to 8 kilobytes.

To then recognize an appliance as being in the "on" or "off" state, the image of the available signal must be compared with an expected image. In the data memory 38, as a complement to the produced image of the available signal, images are presented pertaining to each of the appliances and corresponding to their "on" or "off" state. For each appliance, an expected "on" state image at least, and an expected general "off" state will comprises a same structure as the image produced from the available signal. In practice, the memory 38 will comprises a stored image 52 of the expected image for all the appliances that are off and an image 53 for the appliance A1 in operation. Similarly, for the appliance A2, images 54 and 55 will be available and so on and so forth for the other appliances. It will be noted that the image 52 is identical to the image 54. It does not need to be stored several times.

Here, only spectral components have been represented diagrammatically in the images 52 to 55. Thus, for the appliance A1, depending on whether it is off or on, spectral components with frequencies f1 and f2 are not presented or, on the contrary, are presented. For the appliance A2, spectral components located between the frequencies f1 and f2 are respectively absent or shown. Briefly, in the measured signal 49, the significant presence of the spectral components f1 and f2 is detected, as also a significant presence of components located between f1 and f2. It will be deduced therefrom, for the measured signal 49, that it corresponds to an "on" state of the appliances A1 and A2 only. In reality, the comparison will be made between an image produced with its mean and variance temporal and spectral samples, and the corresponding total images 52, 53, and 54.

At this stage, an explanation remains to be given of how the images 52 to 55 are obtained and furthermore how the deductions indicated above are obtained so that it is possible, in the result memory 39, to display the fact that the appliances A1 and A2 are on or not on at the time of the measurement.

The images 52 to 55 can be obtained in several ways. In a preferred way, in an unknown installation, a calibration will be performed. In this case, the electricity supplier and the user co-operate to stop all the appliances and measure an available signal 52 (or 54 which is the same) representing the architecture of the network when no appliance is on. Then, each appliance is powered on by itself, and during this powering-on operation, an image 53 or 55 or any other image is measured as in the case of the images 49 and 51. It is associated in the memory 38 with the concerned appliance. In the numerically calculated example given here above, with an expected image taking up eight kilobytes, the memory should have a capacity such that it can contain as many times eight kilobytes as there are appliances to be monitored, plus 1.

In another way, each appliance can be provided with an identification circuit 56. A circuit 56 of this kind is shown in FIG. 1. This circuit 56 has two inputs connected to the power supply conductors 1 and 4, but after the "on" switch 10. In other words, when the appliance A1 shown is not on, the circuit 56 is not perceived by the coupler 13 of the measuring device. However, when the appliance A1 is on, the circuit 56 is perceived and reinjects the signal that characterizes it into the network. The circuit 56 according to the invention will preferably comprise a power supply frequency rejector 57 which is furthermore parallel-connected with a stopper circuit comprising an inductor 58 parallel-connected with a capacitor 59. The assembly 58–59 is designed to resonate at a characteristic frequency dependent on the value of the inductor 58 and on that of the capacitor 59. By choosing components 58 and 59 that are identical but of poor manufacturing quality, it is certain that, with the measurement precision indicated in the invention, each circuit will behave in a manner that is sufficiently different to characterize the appliance sufficiently. In this case, the specific statistical image of an appliance will represent the specific spectral components of the circuit 58, 59. In this case, the operation to calibrate each appliance in the "on" state is not necessary. It is enough to calibrate the network when no appliance is in operation. This is relatively easy to do.

The spectral breakdown can be performed by FFT (Fast Fourier Transform) circuits. However, preferably, it will be carried out by a breakdown of the received signal into wavelets. To produce a signal corresponding to this breakdown into wavelets, preferably characteristic signals known in transmission will be used to accept a breakdown of this kind. FIG. 2 gives a simplified view of the filter 60 used to break down a received signal into wavelets. To make the filter 60, a hierarchical breakdown of the received and digitized signals will be chosen. In this breakdown, a signal with M samples is broken down iteratively into L signals with M/L samples. In a preferred way, the breakdown will be dyadic (whereas it could be triadic or any other kind of the breakdown) and, in this case, L will be equal to 2. FIG. 1 shows a dyadic breakdown. A breakdown of this kind is described especially in Stéphane MALLAT, "A theory for multiresolution signal decomposition: the wavelet representation", IEEE Transaction on pattern analysis and machine intelligence, Vol. 11, pages 674–693, July 1989.

In one step of a breakdown of this kind, in a processing circuit 61, the received digital signal is broken down into a low-frequency component and a high-frequency component. In practice, the processing is a software processing but the explanation in the form of circuits or functions is better suited to an understanding of the invention. The circuit 61 is a Mallat type circuit. Its function is equivalent to making the signal pass, firstly, into a low-frequency finite impulse response filter 62 with a transfer function g and, secondly, into a high-frequency finite impulse response filter 63 with a transfer function h. To simplify the explanation, it will be said the cut-off frequency common to the filters 62 and 63 of the circuit 61 will be a frequency located in the middle of the bandwidth of the signal R1–R2. In a preferred example, the filters 60 to 63 are digital filters with Q coefficients, namely filters capable of storing Q samples (at a first iteration). The number Q of coefficients is preferably taken to be equal to 10. This is sufficient.

According to the theory presented in the above article, the quantity of information in the signal accepted at the input to the filters 62 and 63 does not suffer deterioration if the signal produced by each of these filters 62 and 63 is sampled at half the rate of sampling of the signal taken in at input of the Mallat circuit 61. To this end, sub-sampling circuits, 65 and 66 respectively, are used to sub-sample the signals delivered by the filters 62 and 63. As an alternative, the digital filters 62 and 63 can be made to work every other time, namely at the elementary level once they have received two successive samples. In practical terms, it has been shown here that the samples are all processed but that only one in two samples is chosen.

If the breakdown is triadic, instead of having a low-frequency filter 62 and a high-frequency filter 63, these two filters will be located on either side of an intermediate filter. In this case, the cut-off frequency of the filters will be replaced by two cut-off frequencies tending to divide the total bandwidth into three equal parts. Thus, continuing in this way, the explanation can be generalized.

The circuit 61 thus delivers low-frequency components at an output 67 and high-frequency components at an output 68. These low-frequency and high-frequency components each undergo conversions in circuits 69 and 70 which, for their part, are also Mallat type circuits but for subsequent iteration, they undergo transformations in circuits that are identified as Mallat circuits implementing a breakdown identical to the breakdown of the circuit 61.

However, from one described iteration 71 to a following iteration 72, the cut-off frequencies of the Mallat circuits 69 and 70, which are respectively low-frequency and high-frequency circuits, will be frequencies located each time at half of the total half-bands separated by the cut-off frequency. Thus, continuing in this way, the subsequent iterations, for example the iteration 73, enable the performance of an identical processing operation. Here we have shown four iterations leading at output to the availability of eight Mallat circuits, hence 16 wavelets. Since this is a breakdown into $2^8$, the number of iterations will be equal to 8. The example. is only shown here in a simplified way with four iterations. With eight iterations, there will be 1024 output samples available. Each of the samples can then be processed separately.

To edit the characteristic signal sent, it is possible to use inverted Mallat circuits, each provided with a low-frequency channel and a high-frequency channel. Each channel will then have an over-sampling circuit. In a preferred particular case, the over-sampling circuit will add a zero between each sample coming from a prior, inverse Mallat circuit. Each over-sampling circuit will be followed by a filter, which is respectively a low-frequency or high-frequency conjugate filter of the filters 62 and 63. The outputs of the two conjugate filters will be connected to a logic adder. This logic adder could be tabulated as the case may be. It will add the signals quantified on R bits, coming from the output of the conjugate filters, on R+1 bits to reconstitute a sequence of M samples. By acting in this way, using 1024 wavelets, it is possible to digitally constitute the signal X. In reception, the circuit 60 will be used to carry out the reverse breakdown.

Since the breakdown into Mallat wavelets is reversible, the original signal can be reconstructed. In practice, it is possible to determine the state of the network directly on the basis of knowledge of the signal in the sub-bands. This reconstitution is therefore not necessary.

The method can be implemented by sending a Dirac pulse and by breaking down the code received by means of the Mallat algorithm. In a preferred way in the invention, the wavelets corresponding to the different sub-bands will be sent directly. The corresponding echoes directly give the breakdown into sub-bands of the echo corresponding to a Dirac pulse.

Preferably, at reception, the circuit 60 will comprise an elimination circuit 74. In the circuit 74, from each sample received, the contribution made by the leaks from the duplexer 25 will be subtracted. These leaks do not represent the echo. For the measurement of these leaks, the conductors 1 and 4 are loaded with a perfectly suited load and the supposedly received signal is measured. This signal represents only leaks. To subtract it, a sample-indexed version is extracted therefrom. This measurement can also be made in the laboratory.

In practice, the above digital processing operations are implemented by the microprocessor 35. It will be noted that the filter 61 must produce twice M/2 filters while the filters 69 and 70 must together produce four times M/4 samples. Ultimately, the work performed by the microprocessor for each step or each iteration is identical. In a circuit 60, with filters such a 62 and 63 having M coefficients, this amounts to carrying out 2×M×8 elementary operations each time. A processing operation this kind is quite within the scope of a low-cost digital microprocessor.

To now compare image produced with an expected image, it is necessary to minimize the distance between each of the four K values of an image 49–51 produced and an algebraic composition of the expected images 52–55. This composition corresponds to the "on" states of the different appliances. This minimization can be done in different known ways. It can be carried out either by a least error squares regression type of method or by using a neural network. A method using a neural network, which is known per se, is preferred because it is faster and less demanding in terms of electronic processing resources.

Figure 3A:
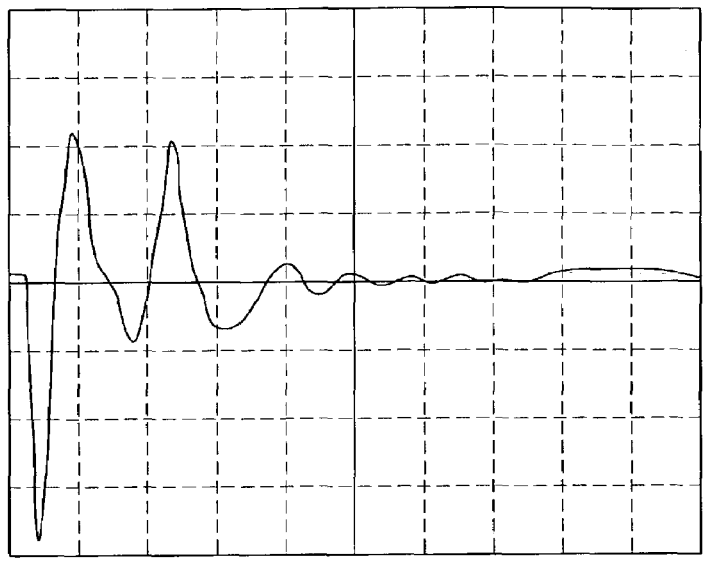
FIGS. 3a and 3b are timing diagrams of signals measured for an appliance showing a difference of response depending on whether the appliance is "on" or "off".
Figure 3B:
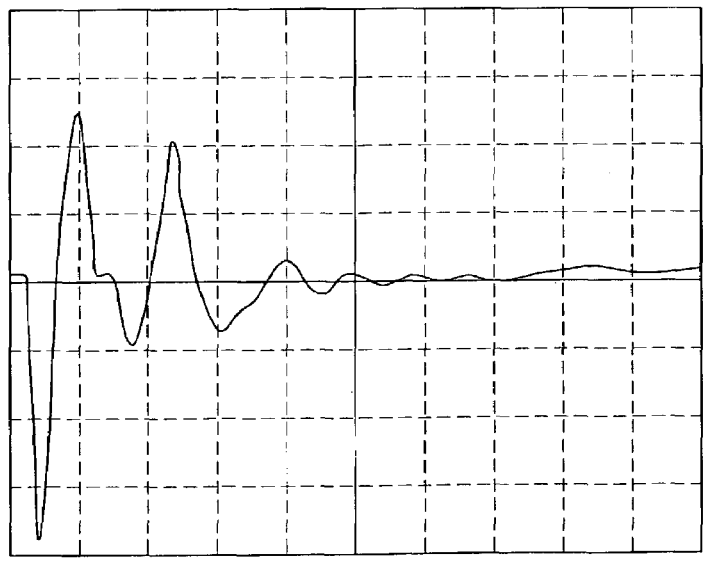

FIGS. 3a and 3b give an exemplary view of a real measurement of a an available temporal echo signal depending on whether the appliance studied is off or on.

The invention claimed is:

1. Method for the analysis of a network of electrical power supply conductors, comprising steps in which:
    an available signal is obtained at a node of the network,
    a temporal or spectral image of the available signal is produced,
    the image obtained is compared with an expected image that comprises an image indicative of an "on" state or an "off" state of operation of an appliance connected to the network,
    a deduction is made therefrom of an "on" or "off" state of operation for at least one of a plurality of appliances connected to the network and corresponding to the expected image.

2. Method according to claim 1, wherein the measured signal is measured a plurality of times, a statistical image of the measured signal is formed therefrom, and the statistical image is compared with the expected image.

3. Method according to claim 2, wherein a characteristic signal is sent from a node of the network, and an echo, reflected by a network of conductors, of the sent signal is measured as the available signal.

4. Method according to claim 3, wherein during measurement the signal is broken down into wavelets of separate frequency bands, and the wavelet signals are processed separately.

5. Method according to one of the claims 1 to 4, wherein the expected images of the appliances are produced by a calibration of the network of conductors during which at the node of the network, the available signal is measured for an "on" state and for an "off" state of the appliance.

6. Method according to claim 5, wherein to make the comparison, a method of analysis by neural networks is implemented.

7. Device for the analysis of a network of electrical power supply conductors comprising a circuit for the measurement, at a node of the network, of an available signal, a circuit to produce a temporal image and/or a spectral image of the available signal, wherein that it comprises a circuit to compare the image produced with an expected signal image of a working or non-working appliance operation state, and a circuit to deduce a state of operation of one among several appliances connected to the network and corresponding to this expected image.

8. Device according to claim 7, further comprising a duplexer configured to send out a characteristic signal from a node of the network, and to receive an echo of this sent signal, reflected by the network of conductors, as an available signal.

9. Device according to claim 8, further comprising a circuit for the elimination, in the available signal, of a leakage of the sent signal.

10. Device according to one of the claims 7 to 9, further comprising a reactive identification stopper circuit parallel-mounted on the supply input of an appliance.

11. A device for the analysis of a network of electrical power supply conductors comprising:
    a plurality of appliances each connected to a node of the network through which power is available to each one of the plurality of appliances;
    a signal injector that outputs an operating condition test signal;
    a bridge linked to the signal injector and linked to each one of the plurality of appliances for delivering the operating condition test signal to each one of the plurality of appliances;
    a signal pass filter between the plurality of appliances and the bridge permitting a reflected signal from a plurality of the appliances to pass through while opposing passage of the network power delivered to the plurality of appliances;
    a processor configured to analyze the reflected signal of each one of the plurality of appliances against a reference signal and determine whether the corresponding appliance is operational based thereon.

12. A device according to claim 11, further comprising a biasing circuit between the bridge and the processor and a low pass filter between the biasing circuit and the processor.

13. A device according to claim 11, wherein the processor comprises a microprocessor that is configured to compare a waveform of the reflected signal to a reference signal waveform and indicate corresponding appliance operation should the comparison be similar and indicate corresponding appliance inaction should the comparison be dissimilar.

14. A device according to claim 11, wherein the reflected signal comprises a waveform image that is sampled a plurality of times and averaged to obtain a corresponding average reflected signal waveform image that is compared against a reference signal waveform image in determining appliance operational status.

15. A device according to claim 11 comprising means for separating the reflected signal into a plurality of wavelets each of which are separately compared against a corresponding wavelet reference signal.

16. A device according to claim 15 wherein the wavelet separating means comprises means for breaking the reflected signal into a plurality of reflected signal components each comprised of a separate frequency range with each wavelet comprising one of the reflected signal components.

17. A device according to claim 11 further comprising calibration means for producing at least one reference signal.

18. A device according to claim 11 further comprising neural network means for comparing the reflected signal to the reference signal.

19. A device according to claim 11 further comprising a leakage elimination circuit disposed in communication with the network and the plurality of appliances.

20. A device according to claim 11 further comprising a reactive attenuator in parallel with a power supply input of at least one of the appliances.

* * * * *